US008053935B2

(12) United States Patent
Knight et al.

(10) Patent No.: US 8,053,935 B2
(45) Date of Patent: Nov. 8, 2011

(54) ADAPTER RETROFIT BY REPLACEMENT COMPONENT

(75) Inventors: John M. Knight, Saint Joseph, MI (US); Richard A. McCoy, Stevensville, MI (US); Ameresh B. Viswanathan, Saint Joseph, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 323 days.

(21) Appl. No.: 12/341,129

(22) Filed: Dec. 22, 2008

(65) Prior Publication Data

US 2010/0157511 A1 Jun. 24, 2010

(51) Int. Cl.
*G01R 1/20* (2006.01)
*F25D 15/00* (2006.01)

(52) U.S. Cl. .......................................... 307/154; 62/331

(58) Field of Classification Search .................. 307/154; 62/331

See application file for complete search history.

(56) References Cited

U.S. PATENT DOCUMENTS

| | | | | |
|---|---|---|---|---|
| 4,544,991 | A * | 10/1985 | Gorsuch | 362/495 |
| 6,453,687 | B2 * | 9/2002 | Sharood et al. | 62/127 |
| 6,480,753 | B1 | 11/2002 | Calder et al. | |
| 6,584,786 | B2 | 7/2003 | Tavolazzi | |
| 6,786,058 | B2 | 9/2004 | Sanna | |
| 7,082,777 | B2 | 8/2006 | Becke et al. | |
| 7,228,701 | B2 | 6/2007 | Kim | |
| 7,444,210 | B2 | 10/2008 | Breed et al. | |
| 7,810,343 | B2 * | 10/2010 | McCoy et al. | 62/331 |
| 2006/0237427 | A1 | 10/2006 | Logan | |
| 2007/0086151 | A1 | 4/2007 | Oh et al. | |
| 2007/0180869 | A1 | 8/2007 | Geyer | |
| 2007/0220916 | A1 | 9/2007 | Fulton | |

FOREIGN PATENT DOCUMENTS

| | | | |
|---|---|---|---|
| CN | 2583586 | Y | 10/2003 |
| DE | 20207052 | U1 | 9/2002 |
| EP | 1640668 | A2 | 3/2006 |
| JP | 2230026 | A | 9/1990 |
| JP | 2003323232 | A | 11/2003 |
| WO | 97/26486 | A1 | 7/1997 |
| WO | 2006/048748 | A2 | 5/2006 |

* cited by examiner

*Primary Examiner* — Michael Rutland Wallis
(74) *Attorney, Agent, or Firm* — Robert A. Bacon; McGarry Bair PC

(57) ABSTRACT

An appliance having various mechanical components that can be replaced with a component that provides power or data to the appliance. The component being replaced includes handles, trim pieces, face plates, or the like. The source of power to the new mechanical component comes from an external source which can also provide data.

11 Claims, 5 Drawing Sheets

ADAPTER RETROFIT BY REPLACEMENT COMPONENT

TECHNICAL FIELD

This disclosure relates generally to replacement parts for structures and, more particularly, to an adaptor retrofit component that replaces a mechanical component in an existing structure, whereby the adaptor retrofit component provides power or data.

The present application is related to the following patent applications filed concurrently herewith: U.S. patent application Ser. No. 12/341,217, entitled Replacement Handle With Power Supply U.S. patent application No. 12/341,042, entitled Handle With Docking Station, and U.S. patent application Ser. No. 12/341,094, entitled Method Of Providing A Replacement Component.

BACKGROUND OF THE INVENTION

Traditionally, appliances, consumer electronic devices, and other useful household machinery are located in a room dedicated to the function supported by the appliance. For example, the kitchen has traditionally been limited to a space for preparing and eating meals and consequently has been mostly occupied by cabinetry and large home appliances such as refrigerators, dishwashers, and ovens. The family room has been designated as a place for leisure activities, and so most entertainment devices, such as televisions and video games are commonly found here. Laundry rooms normally house a washer, dryer, and iron. Devices such as personal computers and printers are often located in another room, such as a dedicated home office or bedroom.

Consumers increasingly own multiple consumer electronic devices (CEDs), such as hand-held electronic devices, laptops, cell phones, PDAs, digital cameras, video recorders, and digital music players. These devices are typically used in many different rooms in the house and are often carried from room to room throughout the home. Consumers also tend to perform non-traditional tasks in the traditional rooms of the home. For example, consumers also tend to eat in the living room or media room, instead of the dining room. Consumers tend to eat, meet and entertain in the kitchen, not just the dining room and family room. In fact, the kitchen is often the hub of most household activity. Consumers also tend to work in every room of the home with the adoption of laptop computers, cellular phones, PDA's and wireless networks.

Therefore, there is a trend for consumers to perform non-traditional functions in a household room designed for a traditional function. The disclosure recognizes this trend and attempts to support the trend.

BRIEF SUMMARY OF THE INVENTION

According to an illustration of the disclosure, a retrofit component for an appliance is provided that allows a consumer to replace an existing kick plate on the structure, with a kick plate that is operable to receive an electrical service.

DETAILED DESCRIPTION OF THE INVENTION

Figure 1:
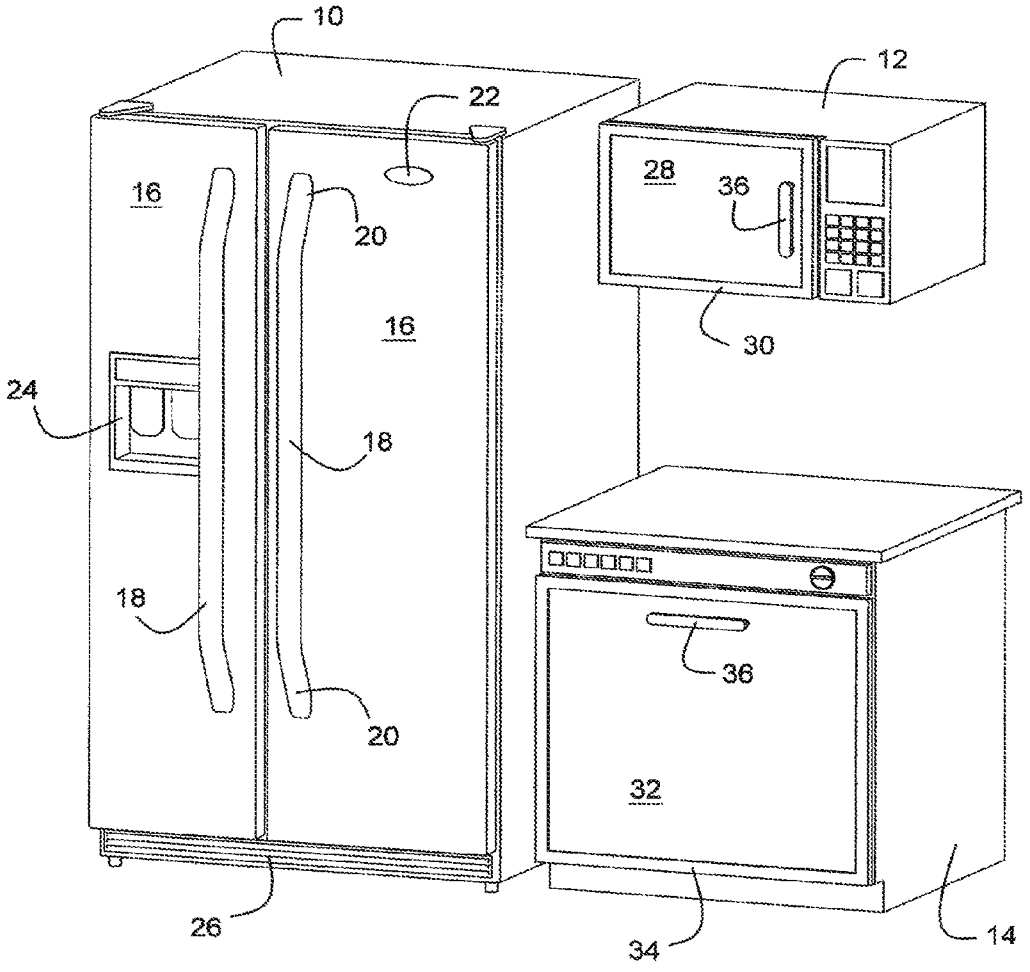
FIG. 1 PRIOR ART
FIG. 1 is an illustration of a traditional refrigerator, dishwasher and microwave.

Referring now to the drawings, preferred embodiments of the present invention are shown in detail. Although the drawings represent embodiments of the present invention, the drawings are not necessarily to scale and certain features may be exaggerated to better illustrate and explain the present invention. The embodiments set forth herein are not intended to be exhaustive or otherwise limit the invention to the precise forms disclosed in the following detailed description.

FIG. 1 is a conventional home appliance arrangement having a refrigerator 10, a microwave 12 and a dishwasher 14. The refrigerator 10 has a closure or door 16 that is movably mounted to the refrigerator 10. Handles 18 are secured at mounting points 20 to the door 16 as well as a company badge 22 which may display a company symbol. An ice and water dispenser 24 forms a portion of the door 16. A trim plate 26 is secured to the refrigerator 10 and provides access to the underside of the refrigerator 10.

The refrigerator 10 has numerous mechanical components including, but not limited to, the door 16, handle 18, badge 22, ice dispenser 24, and trim plate 26, that can be replaced with a replacement mechanical component that provides power. The mechanical components provide a first function. However, the replacement mechanical components (not shown) not only are operable to provide the first function, they are operable to provide yet other functions such as providing power and/or data and/or another service to a CED. Thus, the replacement mechanical component is operable to provide more than the original function of the mechanical component it replaced.

With respect to the microwave 12, a door 28 is provided having a trim fascia 30 securable to the outer surface of the door 28. Likewise, the dishwasher 14 has a door 32 and associated trim components 34. A handle 36 is provided for the microwave 12 and the dishwasher 14 for assisting with opening and closing the doors.

The handles 36, trim fascia 30 and trim components 34 are mechanical components that, if desired, can be replaced with a mechanical component having power, or another service associated therewith.

Figure 2:
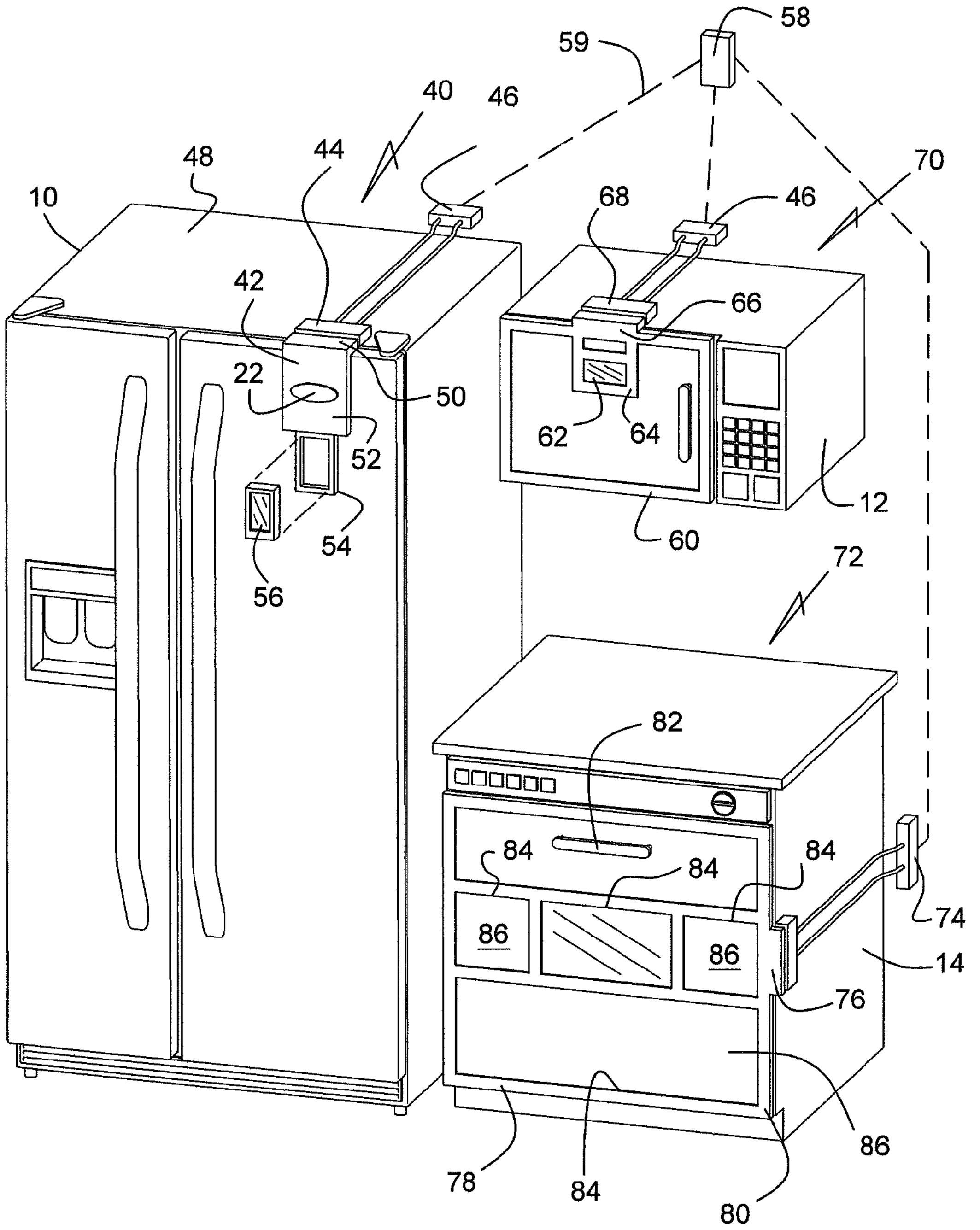
FIG. 2 illustrates assorted appliances having a mechanical component replaced with a new mechanical component having power or data.

FIG. 2 illustrates a system of appliances that have had assorted mechanical components replaced with a new mechanical component that now provides power and/or data or another service to a CED. When the terms power or data are referenced herein, it should be understood that power, data or some other service is contemplated to be used with the present invention. Where possible, the same reference numerals will be utilized for simplicity purposes. Moreover, while the following discussion considers the application of replacing a mechanical component with a mechanical component having power and/or data. It will be appreciated that the present invention can be utilized with a variety of host structures, besides appliances. In addition, other examples of appliances besides those illustrated herein, include, but are not limited to, freezers, stoves, ranges, air conditioners, dehumidifiers, water heaters, furnaces, clothes washing machines, clothes drying machines, clothes refreshing machines, non-aqueous washing apparatuses, or any combination thereof.

An adapter retrofit replacement system 40 having a replacement component, such as a badge plate 42, a proximity mounting device 44, and an electrical service 46. The electrical service 46 can be an external source that is separate from the appliance, or in the alternative, the electrical service 46, can receive power and/or data and/or another service from the appliance itself. The electrical service 46 is in communication with the proximity mounting device 44 which may be secured to an outer surface 48 of the refrigerator 10. The proximity mounting device 44 is operable to provide power and/or data to the badge plate 42 which, for purposes of this invention, can be any other mechanical structure needing to have power and/or data. The badge plate 42 has a mounting portion 50, a structure 52 for receiving the badge 22, and an adaptor 54 either securable to or integral with the structure 52. The adaptor 54 is configured to receive a CED 56. Although the CED 56 illustrated is a music player, the CED is any other consumer electronic device, such as, but not limited to, a television, a video camera, a video recorder, a personal computer, a notebook computer, a computer monitor, a video display, a keyboard, a printer, copying equipment, calculator, facsimile machine, scanner, digital storage device, wireless transceiver, an internet router, a power supply, a data recorder, an answering machine, a telephone, a cordless telephone, a video game system, a personal digital assistant, a DVD player, a VHS player, a VCR, a cassette deck, an 8 millimeter video player, a CD player, a smartphone (such as a BlackBerry®), a portable digital video player, an MP3 player, a radio, an audio speaker, a digital picture frame, or a weather station. The CED 56 is operable to receive power and/or data from the adaptor 54 which in turn receives said power or data, from the electrical service 46. By contrast, the CED 56 is operable to transmit signals, data or other service, back to the electrical service 46 for further processing and/or dissemination. Thus, the replacement system 40 is operable to communicate in both directions.

Further, the electrical service 46 may be in communication with a central processor 58. The processor 58 is operable to provide a service to the electrical service and thusly on to the CED. Likewise, the CED 56 may be operable to transmit a signal and/or data 59 to the processor 58. A plurality of hosts such as a refrigerator 10, microwave 12, and dishwasher 14, may be in communication with the processor 58.

With continued reference to FIG. 2, the microwave 12 includes a replacement component trim member 60 having an electrical service 46. The replacement component trim member 60 replaces the trim fascia 30 that was illustrated in FIG. 1. However, the replacement component trim member 60 now is operable to provide power and/or data to a CED 62 that is received within an adaptor 64 that is integral with the replacement component trim member 60. The replacement component trim member 60 further has a first proximity portion 66 that communicates with a proximity device 68. The proximity device 68 is in communication with the electrical service 46 wherein power or data or another service can be are transmitted. The CED 62 can either be integral with, or separate from the adaptor 64. The CED 62 includes those referenced above in the discussion as pertains to CED 56. Thus, a replacement system 70 includes the electrical service 46, proximity device 68, and a replacement component trim member 60 with an associated CED 62.

With continued reference to FIG. 2, another replacement system 72 is provided for a dishwasher 14. A replacement system 72 includes an electrical service 74, a proximity mounting device 76, and a replacement component 78. The replacement component 78 includes a replacement door 80 having a handle 82, adaptors 84, a plurality of CEDs 86 located within each adaptor 84, and a proximity number 88. The adaptors 84 may be integral with, or a separate component, of the replacement door 80. The CEDs 86 can be of a type as discussed above, with reference to CED 56. The CEDs 86 could be integral with each adaptor 84 or can be a separate component or allow them to be displaced from the adaptor 84 and the door 32.

Figure 3:
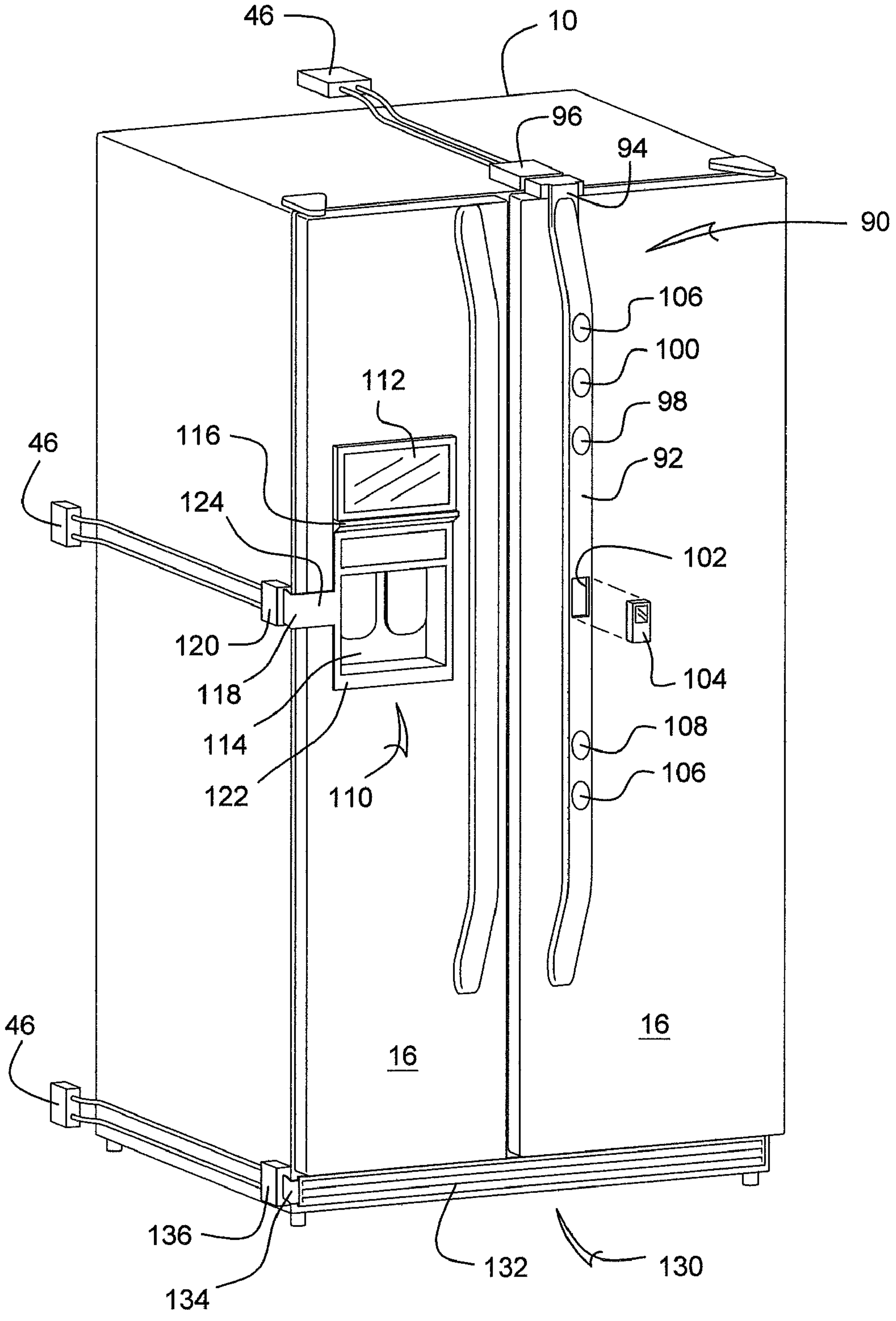
FIG. 3 illustrates an alternative appliance having a replacement part that provides power.

FIG. 3 illustrates an appliance having alternative replacement component assemblies. For example, the replacement component door handle assembly 90 includes a handle 92 with a service, such as power, a first proximity mounting device 94, an attachment interface 95, a second proximity mounting device 96, a power or data pathway 97, and an electrical service 46. The handle 92 replaces the traditional handle 18 as shown in FIG. 1. The handle 92 is operable to provide power and/or data to a CED 98 located in or on the handle, the CED 98 being of the type discussed above with respect to CED 98. For illustrative purposes only, a clock 100 is shown in communication with the handle 92. The attachment interface 95 includes at least one of a magnetic communication surface, an adhesive surface, a hook-and-loop fastener communication surface (such as VELCRO®), a threaded surface configured to mechanically communicate with a compatible threaded component, a gripable surface configured to provide at least two points for attaching two portions of a gripping device, a slot for holding a portion of a component, a ledge for holding a portion of a component, a clasp, a bolt, a screw, a hook, a shelf, a frame, a pouch, a drawer, or a vice. The attachment interface 95 replaces and/or is secured to the mounting points 20.

A docking station 102 is positioned relative to the handle 92 and is operable to receive a CED, such as an MP3 player 104. The MP3 player 104 is in communication via the data pathway 97 with speakers 106 or other output devices that are housed relative to the handle 92. It will be appreciated that power devices 108 may be disposed within the handle 92, and receive power, and/or data, that is transmitted through or on handle 92 by the data pathway 97. Likewise, data may be transmitted from a CED 98 through the handle 92 via the data pathway 97, and onto the electrical service 46 wherein it is further processed or transmitted. Thus, the handle 92 is operable to receive and transmit information, power and/or data by the data pathway 97.

With continued reference to FIG. 3, a replacement component ice and water dispenser assembly is illustrated. The replacement component dispenser assembly 110 replaces the dispenser 24 shown in FIG. 1. This time, however, the novel replacement component dispenser assembly 110 has power and/or data that can be supplied to it and its associated CED 112. The replacement component dispenser assembly 110 includes a dispenser 114, an adaptor or docking station 116, a first proximity mounting device 118, a second proximity mounting device 120 and an electrical service 46. The dispenser 114 includes a housing 122, a connector tab 124 and the docking station 116 which may be integral with, or a separate component of, the housing 122. CED 112 can be removed from the docking station 116.

With continued reference to FIG. 3, the replacement component trim plate assembly 130 replaces the trim plate 26 as illustrated in FIG. 1. The replacement component trim plate assembly 130 is operable to receive power and/or data from the electrical service 46. The replacement component trim plate assembly 130 includes a trim plate 132 and a first proximity mounting device 134. A second proximity mounting device 136 is mounted to a side of the refrigerator 10 and is in communication with the electrical service 46. The replacement component trim plate assembly 130 is operable to provide power or data to a CED (not shown). It will be appreciated that the present invention contemplates replacing a mechanical component of an appliance with a mechanical component that not only provides the function as originally provided, but also provides an additional function. It will be further appreciated that several retrofit replacement components could be employed on a common appliance such as refrigerator 10, and they could be associated so as to be in communication with one another.

Figure 4:
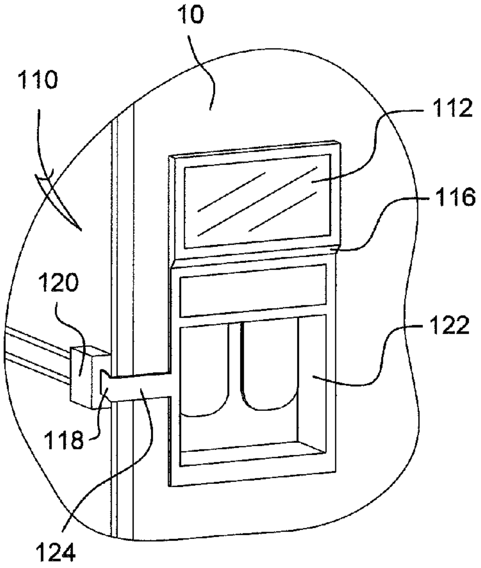
FIG. 4 is a partial prospective view of the FIG. 3 device, illustrating power being supplied to the ice dispenser.
Figure 5:
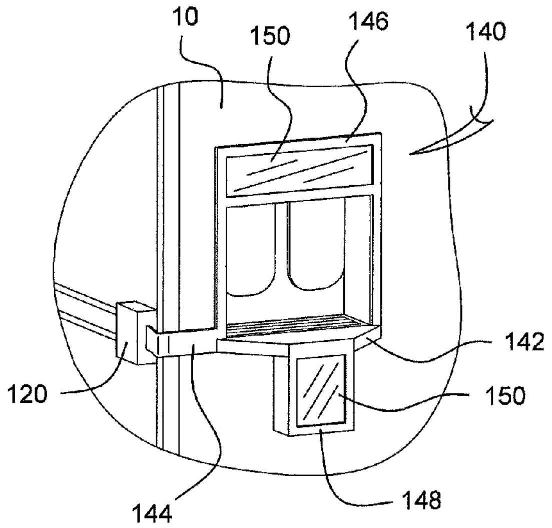
FIG. 5 is an alternative embodiment illustrating power being supplied to an ice dispenser having two consumer electronic devices.

FIG. 4 is an enlarged view of the replacement component dispenser assembly 110 that is depicted in FIG. 3. The replacement component dispenser assembly 110 replaces the previously mentioned dispenser 24. When this is done, new functionality is added to the refrigerator 10. Power and/or data is delivered through the second and first proximity mounting devices, 120, and 118, respectfully, and into the connector tab 124 which can be integral with the housing 122. The power and/or data are then delivered to the docking station 116 which in turn contains an interface for delivering same to the CED 112. If the CED 112 is a receiving device, data or other information can flow reversely from the replacement component dispenser assembly 110 to the electrical service 46 (not shown). With reference to FIG. 5, an alternative replacement component water and ice dispenser assembly 140 is depicted being positioned relative to an refrigerator 10. The alternative replacement assembly 140 includes a housing 142, a proximity interface 144, a first adapter 146 and a second adapter 148. A CED 150 can be positioned within said adapters 146, 148 for communicating therewith. It will be appreciated that the CED 150 can be integral with adapters 146 and 148 so as to form a single assembly. The second adapter 148 is integral with the housing 142. The proximity interface 144 delivers power and/or data to the housing 142 and to the CED 150. Thus, the assembly 140 can receive and provide power to a CED, thus, providing a function other than the original function of the dispenser 24.

Figure 6:
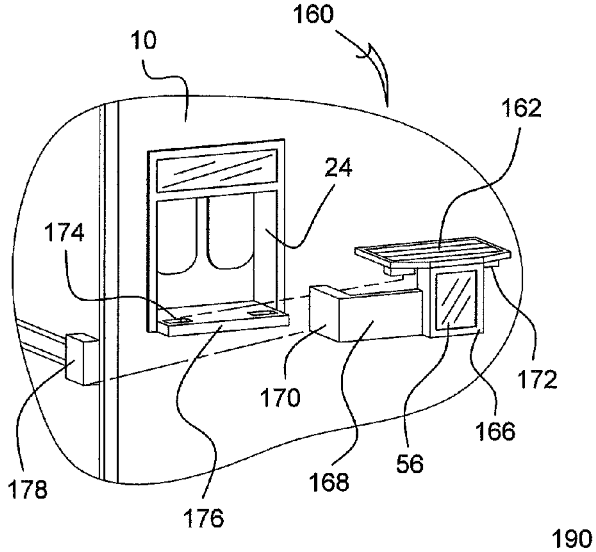
FIG. 6 illustrates an alternative embodiment wherein power is supplied to a drip pan.

FIG. 6 illustrates an alternative replacement component drip pan assembly 160 having power and/or data. The alternative replacement drip pan assembly 160 includes a drip pan 162 and an adapter 166, a tab connector 168, and a proximity interface 170. Tabs 172 are operable to be received within slots 174 of the bezel 176 of an ice and water dispenser 24. A proximity device 178 receives power and/or data from an electrical service 46 (not shown).

A CED 56 is positioned within the adapter 166 and receives power and/or data from the electrical service 46. Conversely, signals may be processed by the CED 56 and in turn delivered through the proximity interface 170 and on to the electrical service 46. The CED 56 can be integral with the adapter 166, or, can be removably connected to be used portably by a consumer.

Figure 7:
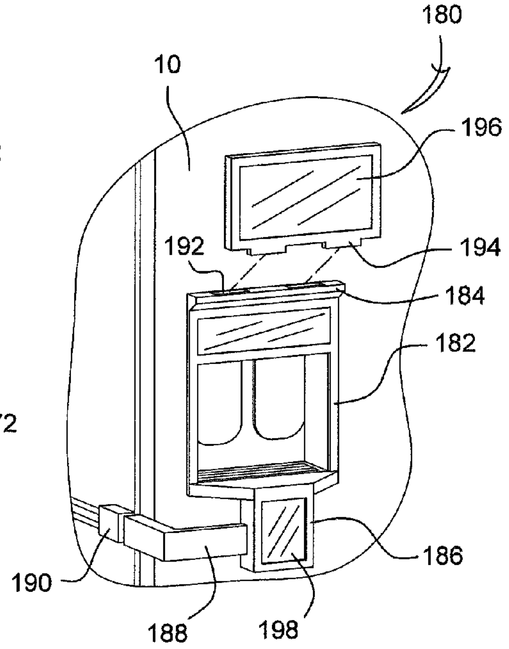
FIG. 7 illustrates an alternative embodiment wherein power is supplied to the drip pan assembly with a pair of consumer electronic devices in communication therewith.

FIG. 7 illustrates an alternative replacement component ice and water dispenser assembly 180 having power and/or data delivered to a plurality of CEDs. The alternative replacement dispenser assembly 180 includes a housing 182, a first adapter 184, a second adapter 186, and a connector tab 188 that is in communication with the second adapter 186. The proximity interface 190 receives power and/or data from an electrical service 46 (not shown). Thus, power and/or data are delivered through the connector tab 188, and through the second adapter 186. Power and/or data is then transferred through the second adapter 186, through other portions of the housing 182, and then to the first adapter 184. The first adapter 184 has a pair of interface ports 192 that mate with interface tabs 194 on the lower end of a CED 196. The CED 196 thus can be displaced from the housing 182 so as to be portable for the consumer to utilize. The CED 196 is operable to download information and/or data to and through the housing 182 which in turn is delivered back out to the electrical service 46. It will be appreciated that the alternative replacement dispenser assembly 180 can likewise have the second adapter 186 be removably attached and thus being capable of being separated from the housing 182. Furthermore, the second adapter 186 could be fixed to the housing 182, with the CED 198 capable of being removed from the second adapter 186. Likewise if the consumer replaces the CED 198 back into the second adapter 186, data can be downloaded and/or directly transferred out to the electrical service 46 and/or also to the processor 58 (FIG. 2).

Figure 8:
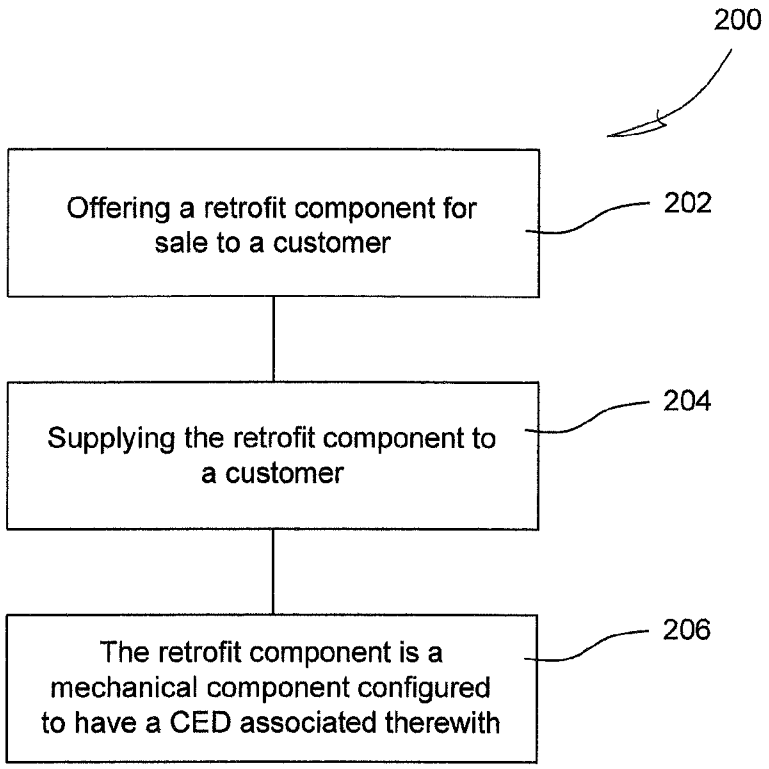
FIG. 8 is a flow chart setting forth a method of operating the present invention.

FIG. 8 illustrates a method of providing a retrofit component 200 for use with a structure, for example an refrigerator 10. The method includes the steps of offering a retrofit component for sale to a customer 202, supplying the retrofit component to the customer 204, wherein the retrofit component is a mechanical component that is configured to have a CED 56 associated therewith 206. The retrofit component may include one of those discussed above including but not limited to a handle, badge, dispenser drip pan, trim plate, etc. The customer may receive instructions on how to install the retrofit component and then to operate the CED associated therewith.

Figure 9:
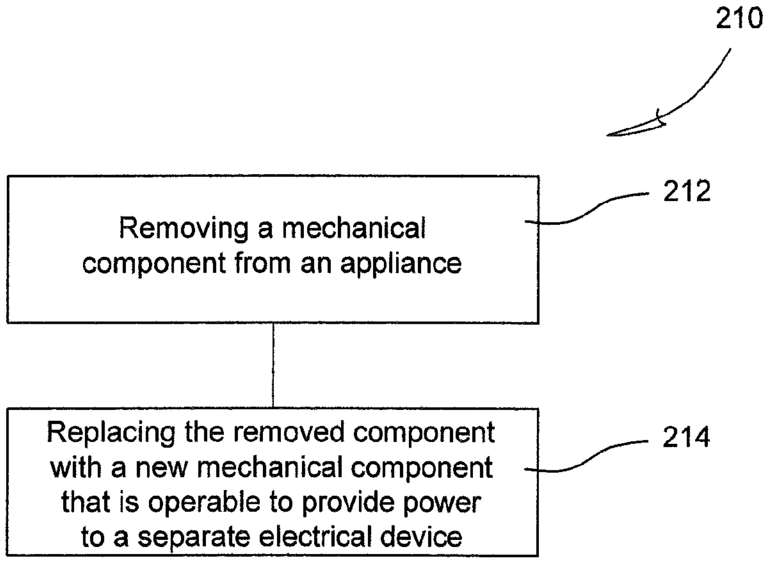
FIG. 9 illustrates an alternative method of operating the present invention.

With reference to FIG. 9, an alternative method 210 is disclosed having a first step 212 of removing a mechanical component from an appliance, and then the next step 214 of replacing the removed mechanical component with a new replacement mechanical component that is operable to provide power to a separate electrical device. The separate electrical device can be of the form as discussed above with reference to CED 56. Likewise, the replacement mechanical component can be one of those discussed herein before.

The present invention has been particularly shown and described with reference to the foregoing embodiments, which are merely illustrative of the best modes for carrying out the invention. It should be understood by those skilled in the art that various alternatives to the embodiments of the invention described herein may be employed in practicing the invention without departing from the spirit and scope of the invention as defined in the following claims. It is intended that the following claims define the scope of the invention and that the method and apparatus within the scope of these claims and their equivalents be covered thereby. This description of the invention should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

What is claimed as new and desired to be protected by Letters Patent of the United States is:

1. A retrofit component for an appliance, the retrofit component comprising:

a kick plate comprising at least one attachment point configured for removably mounting the kick plate to a lower portion of the appliance;

a first electrical interface connected to the kick plate and capable of receiving an electrical service from a source of electrical service and further being capable of communicating with the electrical service; and a device interface in communication with the electrical source of electrical service and the first electrical interface, wherein the device interface is configured for communicating the electrical service to a consumer electronic device.

2. The retrofit component as claimed in claim 1, wherein the at least one attachment point is configured for removably mounting the kick plate to the appliance at a preexisting mounting location along a lower portion of the appliance.

3. The retrofit component as claimed in claim 1, wherein the source of electrical service is an electrical storage device located near the kick plate.

4. The retrofit component as claimed in claim 1, wherein the source of electrical service is a second electrical interface that is a proximity interface that is configured for removably mounting to the appliance, and wherein the first electrical interface is a proximity interface that is configured to receive the electrical service from the second electrical interface when the first electrical interface is in proximity to the second electrical interface.

5. The retrofit component as claimed in claim 1, wherein the appliance includes a housing and a closure moveably mounted to the housing, the closure being movable between an open position remote from the housing and a closed position proximate to the housing, and the kick plate is capable of being removably mounted to the housing at the attachment point below the closure.

6. The retrofit component as claimed in claim 1, wherein the kick plate is configured for replacing a prior kick plate of the appliance.

7. The retrofit component as recited in claim 1, further comprising a second proximity interface configured for removably mounting to the appliance.

8. A retrofit component for a domestic home appliance for performing a physical operation on an article comprising:

a replacement kick plate for supplying a mechanical function to an appliance that can replace a prior kick plate that, when affixed to a lower portion of the appliance, supplies the mechanical function;

an attachment interface provided in association with the replacement kick plate and disposed such that a user can use the attachment interface to affix a new component to the replacement kick plate; and a power supply interface provided in association with the replacement kick plate for supplying power to the new component when the new component is affixed to the attachment interface;

wherein when the prior kick plate is replaced by the replacement kick plate, the mechanical function is supplied to the appliance by the replacement kick plate and power may be supplied to the new component from the power supply interface.

9. The retrofit component as claimed in claim 8, wherein the replacement kick plate is configured to attach to the lower portion of the appliance.

10. The retrofit component as claimed in claim 8, further comprising at least one of a consumer electronic device, an adapter for a device, a mounting bracket, a battery housing, a communication device, a user interface, and a holder for holding a component.

11. The retrofit component as claimed in claim 8, wherein the attachment interface includes at least one of a magnetic communication surface, an adhesive surface, a hook-and-loop fastener communication surface, a threaded surface configured to mechanically communicate with a compatible threaded component, a gripable surface configured to provide at least two points for attaching two portions of a gripping device, a slot for holding a portion of a component, a ledge for holding a portion of a component, a clasp, a bolt, a screw, a hook, a shelf, a frame, a pouch, a drawer, and a vice.

* * * * *